US010385266B2

(12) United States Patent
Moon et al.

(10) Patent No.: US 10,385,266 B2
(45) Date of Patent: Aug. 20, 2019

(54) PHOSPHOR COMPOSITION, LIGHT EMITTING ELEMENT PACKAGE COMPRISING SAME, AND LIGHTING SYSTEM

(71) Applicant: LG INNOTEK CO., LTD., Seoul (KR)

(72) Inventors: Ji Wook Moon, Seoul (KR); Hyoung Jin Kim, Seoul (KR); Chang Man Lim, Seoul (KR); Bong Kul Min, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 237 days.

(21) Appl. No.: 15/506,336

(22) PCT Filed: Aug. 24, 2015

(86) PCT No.: PCT/KR2015/008802
§ 371 (c)(1),
(2) Date: Feb. 24, 2017

(87) PCT Pub. No.: WO2016/032178
PCT Pub. Date: Mar. 3, 2016

(65) Prior Publication Data
US 2017/0292071 A1 Oct. 12, 2017

(30) Foreign Application Priority Data
Aug. 26, 2014 (KR) ........................ 10-2014-0111423

(51) Int. Cl.
*C01F 17/00* (2006.01)
*C09K 11/08* (2006.01)
*C09K 11/61* (2006.01)
*C09K 11/77* (2006.01)
*H01L 33/00* (2010.01)
*H01L 33/50* (2010.01)

(52) U.S. Cl.
CPC ...... *C09K 11/7733* (2013.01); *C01F 17/0012* (2013.01); *C09K 11/0838* (2013.01); *C09K 11/616* (2013.01); *C09K 11/7734* (2013.01); *C09K 11/7774* (2013.01); *H01L 33/0045* (2013.01); *H01L 33/504* (2013.01); *H01L 33/507* (2013.01); *H01L 2224/45144* (2013.01); *H01L 2224/48091* (2013.01); *H01L 2224/8592* (2013.01); *Y02B 20/181* (2013.01)

(58) Field of Classification Search
CPC . H01L 33/504; H01L 33/507; C09K 11/7734; C09K 11/7774; C09K 11/0883; C09K 11/57
See application file for complete search history.

(56) References Cited

U.S. PATENT DOCUMENTS

| 7,253,446 | B2 | 8/2007 | Sakuma et al. |
| 8,456,082 | B2* | 6/2013 | Stiles ................. C09K 11/7721 313/506 |
| 8,779,455 | B2* | 7/2014 | Sakuta ................. H01L 33/504 252/301.4 F |
| 8,890,403 | B2 | 11/2014 | Sakuta et al. |
| 9,321,958 | B2* | 4/2016 | Yoo ..................... C09K 11/7734 |
| 9,614,130 | B2* | 4/2017 | Yamashita ............ H05B 37/02 |
| 10,084,119 | B2* | 9/2018 | Onuma ................ C09K 11/646 |
| 2009/0091237 | A1 | 4/2009 | Hirosaki et al. |
| 2011/0133629 | A1 | 6/2011 | Sakata et al. |
| 2013/0264937 | A1* | 10/2013 | Sakuta .................. H01L 33/504 313/503 |
| 2016/0009990 | A1 | 1/2016 | Yoo et al. |
| 2016/0280993 | A1 | 9/2016 | Emoto |

FOREIGN PATENT DOCUMENTS

| CN | 102099436 A | 6/2011 |
| CN | 103242835 A | 8/2013 |
| CN | 105255494 A | 1/2016 |
| JP | 2012-104814 A | 5/2012 |
| KR | 10-2006-0101295 A | 9/2006 |
| KR | 10-2008-0063897 A | 7/2008 |
| KR | 10-2012-0066308 A | 6/2012 |
| KR | 10-2013-0047022 A | 5/2013 |
| WO | WO 2014/077132 A1 | 5/2014 |
| WO | WO 2014/203841 | * 12/2014 |
| WO | WO 2015/068513 | * 5/2015 |

OTHER PUBLICATIONS

International Search Report, issued in PCT/KR2015/008802 (PCT/ISA/210), dated Oct. 29, 2015.

* cited by examiner

Primary Examiner — C Melissa Koslow
(74) Attorney, Agent, or Firm — Birch, Stewart, Kolasch & Birch, LLP

(57) ABSTRACT

An embodiment provides a phosphor composition and a light emitting device package comprising the same, wherein the phosphor composition comprises green phosphor, amber phosphor, and red phosphor, wherein the amber phosphor is expressed as chemical formula $Li_{m-2x}Si_{12-m-n}Al_{m+n}O_n N_{16-n}:Eu^{2+}$, where $2 \leq m \leq 5$, $2 \leq n \leq 10$, $0.01 \leq X \leq 1$. The light emitting element package of the embodiment can display white light having improved brightness and color rendering index.

21 Claims, 4 Drawing Sheets

[Figure 1]
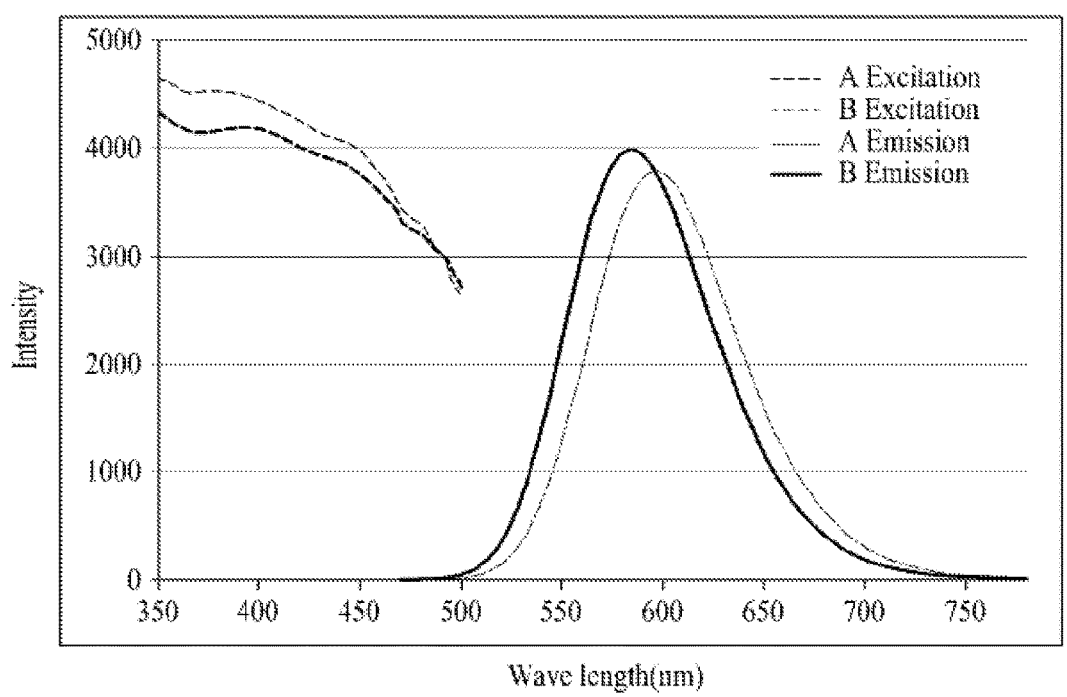
[Figure 2]
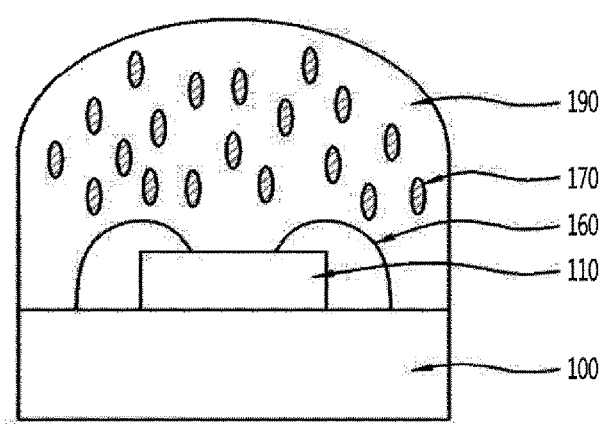

[Figure 3]
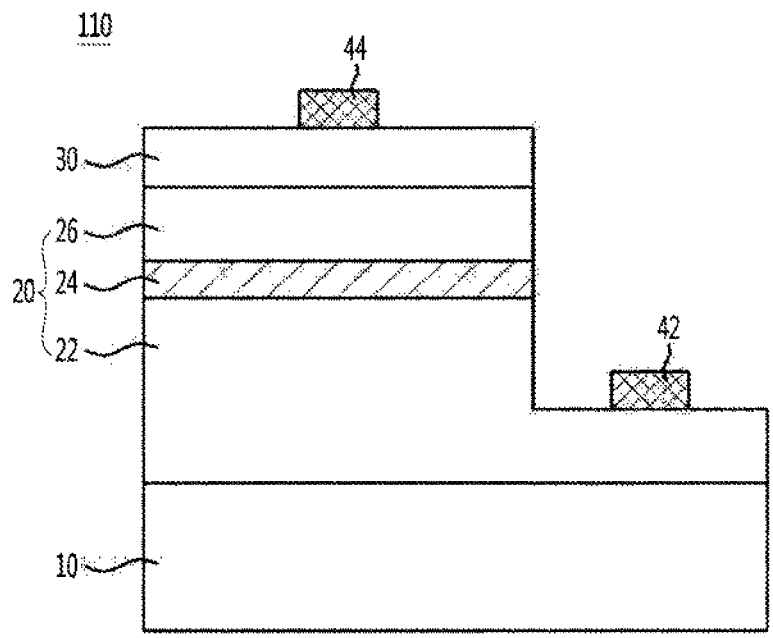
[FIGURE 4A]
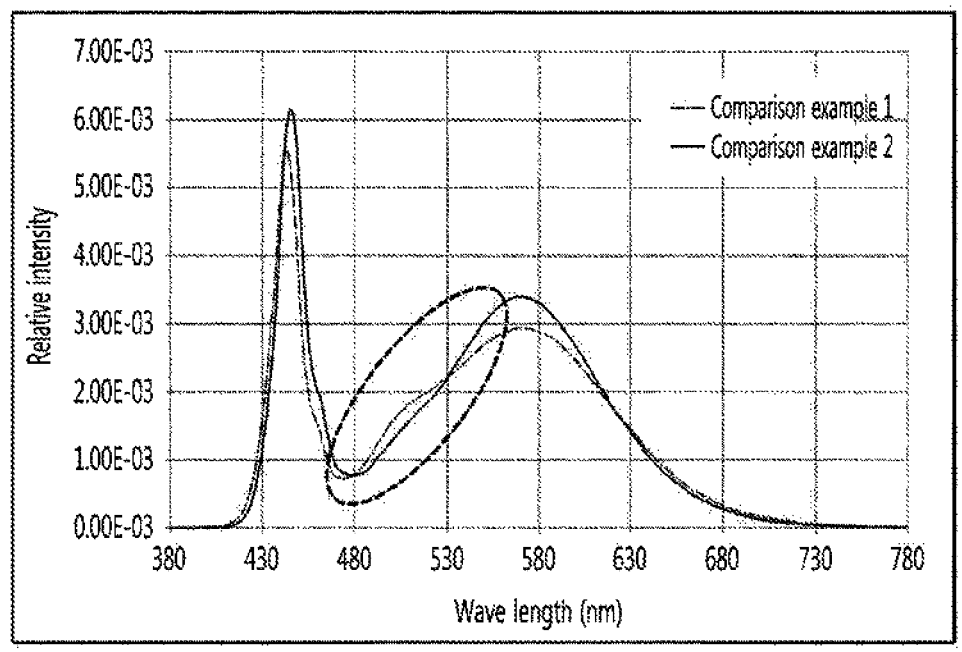

[FIGURE 4B]
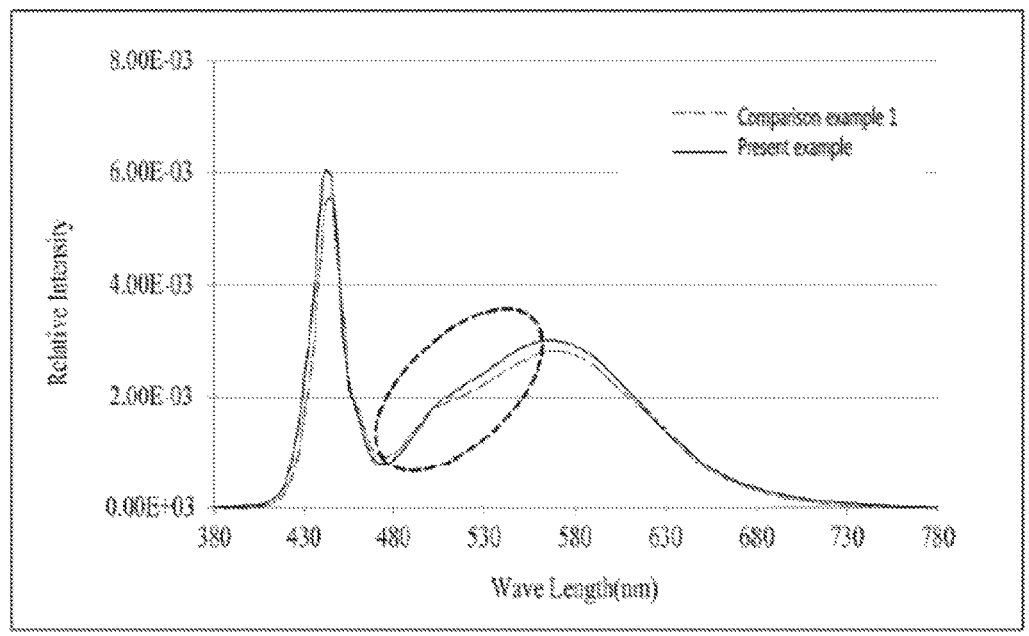
[FIGURE 5]
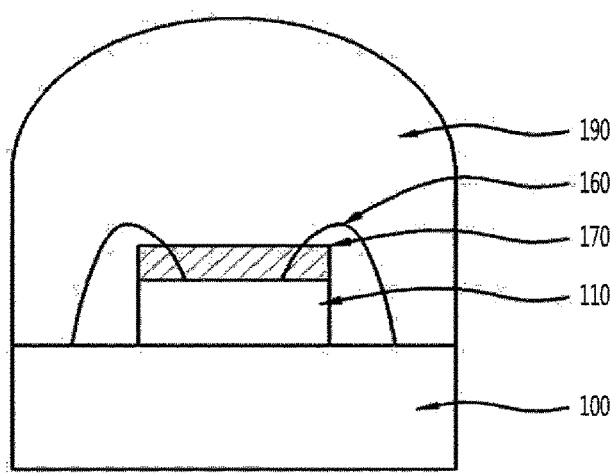

[FIGURE 6]
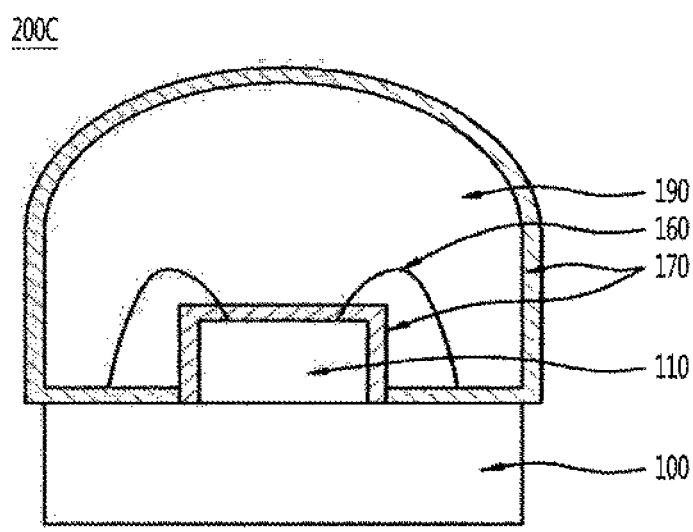

PHOSPHOR COMPOSITION, LIGHT EMITTING ELEMENT PACKAGE COMPRISING SAME, AND LIGHTING SYSTEM

CROSS REFERENCE TO RELATED APPLICATIONS

This application is the National Phase of PCT International Application No. PCT/KR2015/008802, filed on Aug. 24, 2015, which claims priority under 35 U.S.C. 119(a) to Patent Application No. 10-2014-0111423, filed in Republic of Korea on Aug. 26, 2014, all of which are hereby expressly incorporated by reference into the present application.

TECHNICAL FIELD

The present disclosure relates to a phosphor composition having a plurality of phosphors, and a light emitting device package including the same.

BACKGROUND ART

Light emitting devices such as light emitting diodes and laser diodes using III-V group or II-VI group compound semiconductors may realize various colors such as red, green, blue, and ultraviolet, etc. due to development of thin film growth techniques and light emitting device materials. Efficient white light may be achieved by using fluorescent material or color combination. The light emitting devices such as light emitting diodes and laser diodes may have low power consumption, semi-permanent lifetime, fast response speed, safety and environment friendliness compared to conventional light sources such as fluorescent lamps and incandescent lamps.

Methods of realizing the white light may include a method of coating a fluorescent material on a blue or ultraviolet UV light emitting diode chip in a single chip manner, and a method of producing a white light by forming fluorescent chips and blue or ultraviolet UV light emitting diode chips and combing them with each other in a multichip manner.

As for the multi-chip manner, there is a typical method of manufacturing and combing three kinds of chips of RGB (Red, Green, Blue). In this connection, however, because the operation voltages of the RGB chips are uneven or outputs of the RGB chips are different due to the surrounding conditions, the color coordinates thereof change.

In addition, in order that the white light is realized in the single chip manner, at least one phosphor is excited using light emitted from the blue LED.

In the implementation of the white light using such a phosphor composition, there is continuous attempting to improve the luminance and the color rendering index (CRI). However, it may be not easy to realize the white light having a high color rendering index value without reduction in luminous flux.

DISCLOSURE

Technical Problem

The present disclosure is to provide a phosphor composition including green phosphor, amber phosphor and red phosphor with improved luminance and high color rendering index and a light emitting device package including the same.

Technical Solution

In one aspect, there is provided a phosphor composition comprising green phosphor, amber phosphor and red phosphor, wherein the amber phosphor is expressed as chemical formula $Li_{m-2x}Si_{12-m-n}Al_{m+n}O_nN_{16-n}:Eu^{2+}$, where $2 \leq m \leq 5$, $2 \leq n \leq 10$, $0.01 \leq X \leq 1$.

In one implementation, the amber phosphor may have a light-emission wavelength of about 570 nm to 600 nm.

In one implementation, the green phosphor may include at least one selected from a group consisting of $LuAG:Ce^{3+}$, $Sr_2SiO_4:Eu^{2+}$, $La_3Si_6N_{11}:Ce$ and $Ba_2SiO_4:Eu^{2+}$.

In one implementation, the green phosphor may have a light-emission wavelength of about 510 nm to 550 nm.

In one implementation, the red phosphor may include at least one selected from a group consisting of $CaAlSiN_3:Eu^{2+}$, $SrAlSiN_3:Eu^{2+}$ and $Sr_2Si_5N_8:Eu^{2+}$.

In one implementation, the red phosphor may have a light-emission wavelength of about 600 nm to 660 nm.

In one implementation, at least one of the green phosphor, amber phosphor and red phosphor may have an excitation wavelength of 300 nm to 500 nm.

In one implementation, a mass ratio between the green phosphor, the amber phosphor and the red phosphor may be in a range of 0.5 to 0.8:0.1 to 0.4:0.01 to 0.1.

In another aspect, there is provided a phosphor composition comprising green phosphor, amber phosphor and red phosphor, wherein the amber phosphor includes SiAlON-based phosphor with a α phase, wherein a mass ratio between the green phosphor, the amber phosphor and the red phosphor is in a range of 0.5 to 0.8:0.1 to 0.4:0.01 to 0.1.

In still another aspect, there is provided a light emitting device package comprising: a package body; a light emitting device disposed on the package body; a molding portion disposed on the package body so as to surround the light emitting device; and the phosphor composition as defined above, wherein the phosphor composition is excited using light emission from the light emitting device.

In one implementation, the phosphor composition may be dispersed in the molding portion.

In one implementation, the phosphor composition may be layered on and contacts the light emitting device.

In one implementation, the phosphor composition may be layered on at least one of an outer face of the light emitting device, an exposed top face of the package body, and an outer face of the molding portion.

In one implementation, the light emitting device may be configured to emit blue light.

In one implementation, light emission from the light emitting device package may have a color coordinate: Cx=0.328±0.02 and Cy=0.344±0.02.

In one implementation, the light emitting device emits first light-emission and the phosphor composition emits second light-emission via excitation thereof using the first light-emission, wherein mixture between the first and second light-emissions has a color rendering index in a range of 70 to 99 inclusive. In yet still another aspect, there is provided an illumination apparatus comprising: a substrate, a light emitting device package; and an optical member configured to divert a propagation path of a light beam emitted from the package, wherein the package is disposed on the substrate, wherein the package comprises: a package body; a light emitting device disposed on the package body; a molding portion disposed on the package body so as to surround the light emitting device; and the phosphor composition as defined above, wherein the phosphor composition is excited using light emission from the light emitting device.

Advantageous Effects of Invention

In accordance with the present disclosure, the phosphor composition and the light emitting device package including the same may have realize white-light with improved luminance and high color rendering index by containing Li—SiAlON-based amber phosphor therein.

DESCRIPTION OF DRAWINGS

FIG. 1 is a graph illustrating an optical characteristic of one present example of amber phosphor.

FIG. 2 is a diagram of one embodiment of a light emitting device package in accordance with the present disclosure.

FIG. 3 is a diagram of one embodiment of a light emitting device in accordance with the present disclosure.

FIG. 4A to FIG. 4B are graphs illustrating optical characteristics of the light emitting device package in accordance with the present disclosure.

FIG. 5 to FIG. 6 are diagrams of further embodiments of a light emitting device package in accordance with the present disclosure.

MODE FOR INVENTION

Examples of various embodiments are illustrated and described further below. It will be understood that the description herein is not intended to limit the claims to the specific embodiments described.

It will be understood that when an element or layer is referred to as being "connected to", or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present. Spatially relative terms, such as "beneath," "below," "lower," "under," "above," "upper," and the like, may be used herein for ease of explanation to describe one element or feature's relationship to another element s or feature s as illustrated in the figures. It will be understood that the spatially relative terms are intended to encompass different orientations of the device in use or in operation, in addition to the orientation depicted in the figures. When an element A is disposed "on" or "under" an element B, this means that a further element C may or may not be disposed between the element A and element B.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

For simplicity and clarity of illustration, elements in the figures are not necessarily drawn to scale. The same reference numbers in different figures denote the same or similar elements, and as such perform similar functionality. Also, descriptions and details of well-known steps and elements are omitted for simplicity of the description.

In one embodiment, the phosphor composition may include green phosphor, amber phosphor and red phosphor, wherein the amber phosphor may be expressed as a following chemical formula 1:

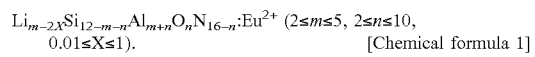

$Li_{m-2x}Si_{12-m-n}Al_{m+n}O_nN_{16-n}:Eu^{2+}$ ($2 \leq m \leq 5$, $2 \leq n \leq 10$, $0.01 \leq X \leq 1$). [Chemical formula 1]

The amber phosphor expressed as the chemical formula 1 may be SiAlON SiAlON-based phosphor having a α phase, and may be excited using blue or visible light to emit amber light. For example, the amber phosphor expressed as the chemical formula 1 may have 400 nm to 500 nm of excitation wavelength.

FIG. 1 is a graph to show comparison between optical characteristics of comparison example amber phosphor and amber phosphor expressed as the chemical formula 1. In the figure, A indicates comparison example amber phosphor, which employs Ca-α-SiAlON phosphor, while B indicates the present example amber phosphor expressed as the chemical formula 1.

In FIG. 1, "Excitation" indicates an excitation wavelength spectrum, while "Emission" indicates a light-emission wavelength peak. As for the comparison example A and present example B, the excitation wavelength may fall within 350 nm to 500 nm. Excitation energy is higher in the present example B than in the comparison example A.

Moreover, as for the light-emission wavelength peak, the luminescence center wavelength shifts to a short wavelength in the present example B. Further, luminance at the luminescence center wavelength may be higher in the present example B than in the comparison example A.

A following table 1 show optical characteristic values of the amber phosphors of the comparison example A and present example B. The optical characteristic values may include a light-emission peak wavelength (Wp) and FWHM (Full Width at Half Maximum) and relative luminance value (%). In particular, as for the relative luminance value, when the phosphor is excited using 450 nm wavelength light, the luminance value of the comparison example A is set to 100%.

TABLE 1

|  | Relative luminance % | Wp nm | FWHM nm |
|---|---|---|---|
| Comparison example A | 100 | 595 | 85 |
| Present example B | 103.1 | 583 | 84 |

Referring to the table 1, the luminescence center wavelength (Wp) is 595 nm in the comparison example A, while the luminescence center wavelength (Wp) is 583 nm in the present example B and thus shifts to the shorter wavelength. The amber phosphor of the present example B with the chemical formula 1 may have FWHM (Full Width at Half Maximum) of 84 nm. Moreover, the luminance may be improved in the present example B compared to the comparison example A by about 3%.

The present phosphor composition may include any one green phosphor of LuAG:Ce$^{3+}$, Sr$_2$SiO$_4$:Eu$^{2+}$, La$_3$Si$_6$N$_{11}$:Ce and Ba$_2$SiO$_4$:Eu$^{2+}$. In this connection, the green phosphor may have 510 nm to 550 nm of light-emission wavelength.

Moreover, the present phosphor composition may include at least one red phosphor of $CaAlSiN_3:Eu^{2+}$, $SrAlSiN_3:Eu^{2+}$ and $Sr_2Si_5N_8:Eu^{2+}$. The present red phosphor may have the light-emission wavelength of 600 nm to 660 nm.

That is, the present phosphor composition may include the red, green and amber phosphors, wherein the amber phosphor may be Li-α-SiAlON phosphor expressed as the chemical formula 1. This phosphor composition may be excited using the light emitted from the light emitting device to realize the white-light.

Since the present phosphor composition includes the amber phosphor with the chemical formula 1, the present phosphor composition may have improved luminance over a phosphor composition containing the conventional amber phosphor, as shown in FIG. 1 and table 1.

However, as for the amber phosphor expressed as the chemical formula 1, the luminescence center wavelength shifts to the shorter wavelength, and, hence, the phosphor composition containing the same may not realize longer wavelength sufficiently. Thus, in order to suppress the reduction in a color gamut due to the fact that the luminescence center wavelength shifts to the shorter wavelength, the phosphor composition may further contain the red phosphor.

In this way, the white-light realized by the present phosphor composition may have improved luminous flux, and good color rendering index value. Further, the white-light realized by the present phosphor composition may have color coordinates similar those realized by the conventional phosphor composition.

In the present phosphor composition, a ratio by mass between the green phosphor, amber phosphor and red phosphor may be in a range of 0.5 to 0.8:0.1 to 0.4:0.01 to 0.1. For example, the green phosphor may be 65% by mass, the amber phosphor expressed as the chemical formula 1 may be 31% by mass, and the red phosphor may be 4% by mass.

When the ratio by mass does not fall within the above-defined range, the white light emission from the present example may have a color coordinate value different from that from the conventional phosphor composition.

Hereinafter, one embodiment of the light emitting device package including the above-defined present phosphor composition will be described with reference to the figures.

FIG. 2 shows a first embodiment 200A of the light emitting device package in accordance with the present disclosure.

The light emitting device package 200A may include a package body 100, a light emitting device 110 disposed on the package body 100, a molding portion 190 disposed on the package body 100 and surrounding the light emitting device 110. In this embodiment, the present phosphor composition 170 as described above may be incorporated in the molding portion 190.

The package body 100 may be made of silicon material, synthetic resin material or metal material, and may be made of a ceramic material having excellent thermal conductivity.

The package body 100 may include a lead frame (not shown) for electrical connection with the light emitting device. When the lead frame is formed in the package body 100, the lead frame may be made of a conductive material such as copper. In one example, the lead frame may be embodied as gold (Au) plating. The lead frame may also reflect light emitted from the light emitting device 110.

Light emitting device 110 may be embodied as light-emission diodes.

FIG. 3 show one embodiment of a light emitting device 110 in accordance with the present disclosure. The light emitting device 110 may include a substrate 10, a first conductive-type semiconductor layer 22, an active layer 24, a second conductive-type semiconductor layer 26, a first electrode 42 and a second electrode 44.

In the light emitting device 110, the substrate 10 may be formed of a material suitable for semiconductor material growth, such as a carrier wafer. The substrate 10 may be made of a material having excellent thermal conductivity. The substrate 10 may include a conductive substrate or an insulating substrate. For example, the substrate 10 may be made of at least one of sapphire($Al_2O_3$), SiC, Si, GaAs, GaN, ZnO, Si, GaP, InP, Ge and $Ga_2O_3$. In addition, the substrate 10 may include roughness on its surface to enhance light extraction efficiency.

A buffer layer (not shown) may be disposed between the substrate 10 and the conductive-type semiconductor layers 22 and 26. The buffer layer (not shown) can be placed to mitigate the difference in lattice mismatch and thermal expansion coefficients between the conductive-type semiconductor layers 22, 26 and substrate 10 materials. The buffer layer may be made of a compound semiconductor of 3-5 groups or 2-6 groups, and may include at least one of, for example, GaN, InN, AlN, InGaN, InAlGaN and AlInN.

The light-emission structure 20 includes the first conductive-type semiconductor layer 22 and the active layer 24 and the second conductive-type semiconductor layer 26.

The first conductive-type semiconductor layer 22 may be formed of a compound semiconductor such as a III-V group or a II-VI group, and may be doped with a first conductive-type dopant. The first conductive-type semiconductor layer 22 may be made of at least one of a semiconductor material having a composition formula of $Al_xIn_yGa_{1-x-y}N$ ($0 \leq x \leq 1$, $0 \leq y = 1$, $0 \leq x+y \leq 1$), AlGaN, GaN, InAlGaN, AlGaAs, GaP, GaAs, GaAsP, AlGaInP.

When the first conductive-type semiconductor layer 22 is an n-type semiconductor layer, the first conductive-type dopant may include an n-type dopant such as Si, Ge, Sn, Se, Te, etc. The first conductive-type semiconductor layer 22 may be formed as a single layer or a multilayer, but the present disclosure is not limited thereto.

The active layer 24 may be sandwiched between the first conductive-type semiconductor layer 22 and second conductive-type semiconductor layer 26. The active layer 24 may refer to a layer in which an electron injected from the first conductive-type semiconductor layer 22 encounters a hole injected from the second conductive-type semiconductor layer 26, thereby to emit light beams based on an energy band of a material of the active layer 24. The active layer 24 may include any one of a single quantum well, a multi quantum well, a quantum dot, or a quantum wire.

The active layer 24 may include a multi quantum well. In this connection, the active layer 24 may be embodied as vertical alternations of a plurality of well layers and a plurality of barrier layers using III-V group compound semiconductor materials. For example, a pair of a well layer/barrier layer may include AlGaN/AlGaN, InGaN/GaN, InGaN/InGaN, AlGaN/GaN, InAlGaN/GaN, GaAs InGaAs/AlGaAs, GaP InGaP/AlGaP. However, the present disclosure is not limited thereto. The well layer may have a smaller energy band gap than the barrier layer.

The second conductive-type semiconductor layer 26 may be formed of a semiconductor compound. The second conductive-type semiconductor layer 26 may be formed of a compound semiconductor such as a III-V group or a II-VI group, and may be doped with a second conductive-type dopant. The second conductive-type semiconductor layer 26 may be made of at least one of semiconductor materials having a composition formula of $In_xAl_yGa_{1-x-y}N$ ($0 \leq x \leq 1$, $0 \leq y=1$, $0 \leq x+y=1$), AlGaN, GaN AlInN, AlGaAs, GaP, GaAs, GaAsP, AlGaInP. For example, the second conductive-type semiconductor layer 26 may be formed of $Al_xGa_{1-x}N$.

When the second conductive-type semiconductor layer 26 is a p-type semiconductor layer, the second conductive-type dopant may be a p-type dopant such as Mg, Zn, Ca, Sr, Ba, etc. The second conductive-type semiconductor layer 26 may be formed as a single layer or a multilayer, but the present disclosure is not limited thereto.

The light emitting device 110 may comprise a plurality of electrodes 42 and 44 on one face thereof. The plurality of electrodes 42 and 44 may embodied as the first electrode 42 and second electrode 44. The first electrode 42 and the second electrode 44 may be located on both faces of the light emitting device 110 respectively, wherein the first electrode 42 may be disposed on the first conductive-type semiconductor layer 22 etched in the mesa form, while the second electrode 44 may be disposed on the semiconductor layer 26.

A light-transmitting conductive layer 30 may be further disposed on the second conductive-type semiconductor layer 26 of the light emitting device 110 so that current may be uniformly supplied from a second electrode pad 44 to the second conductive-type semiconductor layer 26 over a wide area. For example, the light-transmitting conductive layer 30 may be made of at least one of ITO(Indium Tin Oxide), IZO(Indium Zinc Oxide), IZTO(Indium Zinc Tin Oxide), IAZO(Indium Aluminum Zinc Oxide), IGZO(Indium Gallium Zinc Oxide), IGTO(Indium Gallium Tin Oxide), AZO (Aluminum Zinc Oxide), ATO(Antimony Tin Oxide), GZO (Gallium Zinc Oxide), IZON(IZO Nitride), AGZO(Al—Ga ZnO), IGZO(In—Ga ZnO), ZnO(Zinc Oxide), $IrO_x$(Iridium Oxide), $RuO_x$(Ruthenium Oxide), NiO(Nickel Oxide), $RuO_x$/ITO, Ni/$IrO_x$/Au(Gold).

Although the example of the light emitting device 110 shown in FIG. 3 is a example of a horizontal light emitting device, a vertical light emitting device and/or a flip chip type light emitting device may be disposed in the package as shown in FIG. 2 in addition to the horizontal light emitting device shown in FIG. 3.

The light emitting device 110 may emit light having a first wavelength region. The first wavelength region may be of blue light or ultraviolet light.

The light emitting device 110 may be electrically connected to the package body 100 or the lead frame via a wire 160. The wire 160 may be made of conductive material. In one example, the wire 160 may be made of gold (Au) and have a diameter of about 0.8 to 1.6 millimeters. The wire 160 may be cut by an external force if it is too thin. If it is too thick, the material cost may increase and it may become an obstacle to the progress of the light emitted from the light-emission device 110.

As shown in FIG. 2, the molding portion 190 may be disposed on the package body 100 so as to surround the light emitting device 110 in the embodiment of the light emitting device package 200A.

The molding portion 190 may of a dome type. Alternatively, the portion 190 may be formed in different shapes to control the light emitting angle from the light emitting device package. The molding portion 190 may surround and protect the light emitting device 110 and act as a lens to change the path of light emitted from the light emitting device 110.

The molding portion 190 may be made of a resin layer. In this connection, the resin layer may comprise a resin selected from the group consisting of mixtures containing silicone-based resins, epoxy-based resins, and/or acrylic-based resins, or compounds thereof.

In the example of the light emitting device package shown in FIG. 2, the phosphor composition 170 may be included in the molding portion 190. For example, the phosphor composition 170 may be dispersed in the resin layer of the molding portion 190.

FIG. 4A to FIG. 4B are graphs illustrating optical characteristics of the light emitting device package including the present phosphor composition in accordance with the present disclosure.

FIG. 4A shows a graph illustrating an optical characteristic of a comparison example light emitting device package including a phosphor composition including two different phosphors. FIG. 4B shows a graph illustrating an optical characteristic of the present light emitting device package including the phosphor composition including three different phosphors in accordance with the present disclosure.

In FIG. 4A, the comparison example 1 may indicate an optical characteristic of a comparison example light emitting device package including a phosphor composition including two different conventional phosphors: LuAG-based green phosphor and Ca-α-SiAlON amber phosphor. Moreover, the comparison example 2 may indicate an optical characteristic of a comparison example light emitting device package including a phosphor composition including two different conventional phosphors: LuAG-based green phosphor and Li-α-SiAlON amber phosphor with the chemical formula 1.

Referring to FIG. 4A, the comparison example 2 containing the amber phosphor expressed as the chemical formula 1 has improved luminance over the comparison example 1 containing the Ca-α-SiAlON amber phosphor.

A following table 2 indicates optical characteristic values for the light emitting device packages in accordance with the comparison example 1 and comparison example 2 respectively.

The optical characteristics for the light emitting device package may include a luminous intensity and color characteristic. The luminous intensity may be expressed as a relative luminance %, wherein the comparison example 1 may have 100% relative luminance as a reference. The color characteristic may be expressed as CIE (Commission International de l'Eclairage) color coordinate value, and a color rendering index (CRI).

TABLE 2

| | Relative luminance % | CIE Cx | CIE Cy | CRI |
|---|---|---|---|---|
| Comparison example 1 | 100 | 0.327 | 0.344 | 73 |
| Comparison example 2 | 103.8 | 0.330 | 0.345 | 67 |

Referring to the table 2, while the comparison example 2 has improved luminance over the comparison example 1, the color rendering index value for the comparison example 2 is lower than that for the comparison example 1.

Referring to the table 2, the luminance for the comparison example light emitting device package including a phosphor composition including the Li-α-SiAlON amber phosphor with the chemical formula 1 is higher than the luminance for the comparison example light emitting device package including a phosphor composition including Ca-α-SiAlON amber phosphor. From this, it may be confirmed that employing the phosphor with the chemical formula 1 as the amber phosphor allows the wavelength of the light emission to shift to the shorter wavelength and thus allows the comparison example 2 to have improved luminance over the conventional comparison example 1.

Although the luminous flux for the comparison example 2 is larger than that for the comparison example 1 having the conventional phosphor composition by 3.8%, the color rendering index (CRI) value decreases from 73 (the comparison example 1) to 67 (the comparison example 2) due to the shift of the light-emission wavelength toward the shorter wavelength.

FIG. 4B and following table 3 indicate optical characteristics for light emitting device packages in accordance with the present example and comparison example 1 respectively wherein the present phosphor composition includes the green, amber, and red phosphors.

In other words, the phosphor composition in accordance with the present example includes red phosphor in addition to the phosphor composition for comparison example 2. In this connection, the red phosphor may be $CaAlSiN:Eu^{2+}$.

TABLE 3

|  | Relative luminance % | CIE Cx | CIE Cy | CRI |
|---|---|---|---|---|
| Comparison example 1 | 100 | 0.327 | 0.344 | 73 |
| Present example | 104.1 | 0.330 | 0.342 | 72 |

Referring to FIG. 4B and table 3, it is confirmed not only that the present example light emitting device package including the green, amber, and red phosphors has improved luminance over the comparison example 1, but also that color characteristics, namely, the color coordinate value and color rendering index value may substantially equal to those in the comparison example 1.

That is, as for the present example light emitting device package, the conventional amber phosphor is replaced with the Li-α-SiAlON의 amber phosphor with the chemical formula 1, and, further, the red phosphor is added. In this way, the optical characteristic such as the luminance may be improved while maintaining the color characteristics.

Hereinafter, in the present phosphor composition, the green phosphor may be referred to as A, the amber phosphor as B, and the red phosphor as C. In one example, A may be $LuAG:Ce^{3+}$, B may be $Li_{m-2x}Si_{12-m-n}Al_{m+n}O_nN_{16-n}:Eu^{2+}$ (2≤m≤5, 2≤n≤10, 0.01≤X≤1), and C may be $CaAlSiN3:Eu^{2+}$.

Moreover, in the comparison example 1, the phosphor composition includes the green phosphor and amber phosphor. In this connection, the green phosphor A may be $LuAG:Ce^{3+}$, and the amber phosphor B' may be $CaSiAlON:Eu^{2+}$ phosphor.

Moreover, in the present example, when the phosphor composition has 100 mass, a mass ratio between the phosphors A, B and C may be as follows: A:B:C=50 to 80:10 to 40:1 to 10.

A following table 4 indicates mass ratios between the phosphors A, B and C in the phosphor composition for the comparison example 1 and present examples (for example, the present examples 1 to 3).

A following table 5 indicates the optical characteristics for the comparison example 1 and present examples as defined in the table 4. The optical characteristic values of the table 5 may be applied to the light emitting device package 200A of the embodiment shown in FIG. 2. However, the present disclosure is not limited thereto. The optical characteristic values of the table 5 may be equally applied to other embodiments of the light emitting device package to be described later.

In the table 5, the luminous flux for the present examples is increased compared to the comparison example 1. For color characteristics, the color coordinate value and color rendering index value for the present examples exhibit similar levels to those for the comparison example 1.

Therefore, the luminance of the light emitting device package of the present examples is increased without degradation of color characteristics.

TABLE 4

| Example | Mass ratio in phosphor composition |
|---|---|
| comparison example 1 | A:B' = 78:22 |
| present example 1 | A:B:C = 63:34:4 |
| present example 2 | A:B:C = 65:31:4 |
| present example 3 | A:B:C = 67:29:4 |

TABLE 5

| Example | Flux (lm) | CIE x | CIE y | CRI |
|---|---|---|---|---|
| Comparison example 1 | 154.2 | 0.331 | 0.342 | 73.3 |
| Present example 1 | 160.4 | 0.331 | 0.345 | 72.4 |
| Present example 2 | 160.7 | 0.329 | 0.345 | 72.0 |
| Present example 3 | 159.7 | 0.331 | 0.350 | 72.0 |

FIG. 5 and FIG. 6 show further embodiments 200B and 200C of the light emitting device package in accordance with the present disclosure.

Hereinafter, the further embodiments 200B and 200C of the light emitting device package in accordance with the present disclosure will be described with focusing on the differences between the embodiment of the light emitting device package as shown in FIG. 2 and the further embodiments 200B and 200C of the light emitting device package in accordance with the present disclosure.

As shown in FIG. 5 illustrating the present light emitting device package 200B, the phosphor composition 170 may be layered on the light emitting device 110. For example, the phosphor composition 170 may be coated on the light emitting device 110. In this connection, as the phosphor composition 170, a conformal coating layer may be formed by a conformal coating method.

The phosphor layer resulting from the coating of the phosphor composition 170 may be disposed on the upper surface of the light emitting device 110, but not limited thereto. For example, the phosphor layer may be disposed on the side surfaces and the entire upper surface of the light emitting device.

As for the light emitting device package 200B, the light emitted from the light emitting device is emitted while the wavelength thereof is changed through the phosphor layer of the phosphor composition. For example, the light emitting device package may emit the white light via the wavelength change.

FIG. 6 is a view showing another embodiment of the light emitting device package 200C.

In the light emitting device package 200C according to this embodiment, the present phosphor composition 170 may be layered on at least one of an outer face of the light emitting device 110, an exposed upper face of the package body 100, and an outer face of the molding portion 190.

For example, referring to FIG. 6, the phosphor composition 170 may wrap the outer face of the light emitting device 110, and may be layered on the upper face of the package body 100 in which the light emitting device 110 is not formed, and may be layered on the outer face of the molding portion 190.

The layered phosphor composition 170 FIG. 6 may be formed by a coating. A protective layer (not shown) may be further formed on an outer face of the phosphor layer.

In this connection, the protective layer may be to protect the exposed phosphor layer. In one example, the protective layer may made of $SiO_2$ (Silicon Dioxide) or $Si_3N_4$ (Silicon Nitride film). This layer may be formed by sputtering, injection compression molding or chemical vapor deposition (CVD).

In addition, the protective layer may be formed on the phosphor layer of the phosphor composition, and may be formed into a thin film by spray coating.

The light emitting device packages 200A, 200B, and 200C as shown in FIG. 2, FIG. 5 and FIG. 6, each of which includes the above-defined phosphor composition comprising including the green phosphor, the red phosphor, and the amber phosphor having the chemical formula 1, may realize the white-light by enabling the phosphor composition to be excited using the light emitted from the light emitting device.

In this connection, the light emitted from the light emitting device may be blue light, and the color coordinates of white light emitted via excitation using the blue light may be $Cx=0.328\pm0.02$ and $Cy=0.344\pm0.02$.

Furthermore, the color rendering index among the color characteristics of the light emitting device packages 200A, 200B and 200C of the present embodiments may be in a range of 70 to 99 inclusive. The light emitted from the light emitting device packages 200A, 200B and 200C may be a mixture between first light emission from the light emitting device and second light emission emitted from the phosphor composition via excitation thereof using the first light emission.

The light emitting device package is not limited to the examples shown in FIG. 2, FIG. 5 and FIG. 6. For example, the above-described light emitting device packages 200A, 200B and 200C as shown in FIG. 2, FIG. 5 and FIG. 6 may be modified such that the package body 100 may further include a cavity defined therein.

Although not shown in the drawings, the cavity may be formed in the upper face portion of the package body 100. Thus, the cavity portion may have an open top.

The cavity may be formed in a cup shape, a concave container shape or the like. The side face of the cavity may be formed perpendicularly or inclinedly with respect to the bottom surface of the cavity. The cavity may vary in size and shape. The shape of the cavity viewed from the top may be circular, polygonal, elliptical, etc. The cavity may have a curved edge. However, the present disclosure is not limited thereto.

When the cavity is formed in the package body 100, the light emitting device 110 may be received in the cavity. The molding portion may surround the light emitting device 110 and fill the cavity. The molding portion 190 may contain therein the above-described present phosphor composition.

Hereinafter, an image display apparatus and a lighting apparatus will be described which includes the above-described light emitting device packages 200A, 200B, and 200C.

The plurality of light emitting device packages 200A, 200B, and 200C according to the present disclosure may be arrayed on a substrate. A light guide plate, a prism sheet, a diffusion sheet, or the like as an optical member may be disposed along the propagation path of light beams from the light emitting device packages 200A, 200B, and 200C. The light emitting device packages 200A, 200B, 200C, the substrate, and the optical member may collectively function as a backlight unit.

Further, the light emitting device packages 200A, 200B, and 200C according to the present embodiments may be implemented in a display device, a pointing device, and a lighting device.

In this connection, the display device includes a bottom cover, a reflector disposed on the bottom cover, a light emitting module for emitting light, a light guide plate disposed in front of the reflector and guiding light emitted from the light emitting module forward, an optical sheet including prism sheets in front of the light guide plate, a display panel disposed in front of the optical sheet, an image signal output circuit connected to the display panel and supplying an image signal to the display panel, and a color filter disposed in front of the display panel. In this connection, the bottom cover, the reflector, the light emitting module, the light guide plate, and the optical sheet may collectively form a backlight unit.

Further, the illumination device may include a light source module including the substrate and the light emitting device packages 200A, 200B, and 200C according to the above embodiments, a heat sink for dissipating heat of the light source module, and a power supply unit to process or convert the electric signal provided from the outside and to supply the processed or converted signal to the light source module. For example, the lighting device may include a lamp, a head lamp, or a streetlight.

The head lamp includes a light emitting module including the light emitting device packages 200A, 200B, and 200C disposed on a substrate, a reflector that reflects light emitted from the light emitting module in a predetermined direction, for example, forward, and a lens to enable light beams reflected from the reflector to be diverted forward, and a shade that blocks or reflects a portion of the light reflected from the reflector and then directed to the lens to provide a light distribution pattern desired by a designer.

As for the above-mentioned image display apparatus and lighting apparatus, by using the phosphor composition including the red phosphor in combination with the amber phosphor of the chemical formula 1, the luminance can be improved. Even when the luminance is improved and thus the light efficiency is increased, there is no change in the color coordinates and the color rendering index, so that a good color characteristic can be obtained.

Although the invention has been described with reference to the exemplary embodiments, the present disclosure is not limited thereto and those skilled in the art will appreciate that various modifications and variations can be made in the present disclosure without departing from the spirit or scope of the invention. For example, those skilled in the art may modify the components of the embodiments. Differences related to such modifications and applications are interpreted as being within the scope of the present invention described in the appended claims.

INDUSTRIAL APPLICABILITY

The above-defined phosphor composition of the embodiments in accordance with the present disclosure may be employed for the light emitting device package to improve the luminance of the light emission from the package while maintain the CRI.

The invention claimed is:

1. A phosphor composition comprising green phosphor, amber phosphor and red phosphor, wherein the amber phosphor is expressed as chemical formula $Li_{m-2X}Si_{12-m-n}Al_{m+n}O_nN_{16-n}:Eu^{2+}$,
wherein the green phosphor includes at least one selected from a group consisting of $LuAG:Ce^{3+}$ and $Sr_2SiO_4:Eu^2$,
where $2\leq m\leq 5$, $2\leq n\leq 10$, $0.01\leq X\leq 1$.

2. The phosphor composition of claim 1, wherein the amber phosphor has a light-emission wavelength of about 570 nm to 600 nm.

3. The phosphor composition of claim 1, wherein the green phosphor has a light-emission wavelength of about 510 nm to 550 nm.

4. The phosphor composition of claim 1, wherein the red phosphor includes at least one selected from a group consisting of $CaAlSiN_3:Eu^{2+}$, $SrAlSiN_3:Eu^{2+}$ and $Sr_2Si_5N_8:Eu^{2+}$.

5. The phosphor composition of claim 1, wherein the red phosphor has a light-emission wavelength of about 600 nm to 660 nm.

6. The phosphor composition of claim 1, wherein at least one of the green phosphor, amber phosphor and red phosphor has an excitation wavelength of 300 nm to 500 nm.

7. The phosphor composition of claim 1, wherein a mass ratio between the green phosphor, the amber phosphor and the red phosphor is in a range of 0.5 to 0.8:0.1 to 0.4: 0.01 to 0.1.

8. The phosphor composition of claim 7, wherein the mass ratio of the green phosphor is 63%, the mass ratio of the amber phosphor is 34%, and the mass ratio of the red phosphor is 4%.

9. The phosphor composition of claim 7, wherein the mass ratio of the green phosphor is 65%, the mass ratio of the amber phosphor is 31%, and the mass ratio of the red phosphor is 4%.

10. The phosphor composition of claim 7, wherein the mass ratio of the green phosphor is 67%, the mass ratio of the amber phosphor is 29%, and the mass ratio of the red phosphor is 4%.

11. A phosphor composition comprising green phosphor, amber phosphor and red phosphor, wherein the amber phosphor is expressed as chemical formula $Li_{m-2X}Si_{12-m-n}Al_{m+n}O_nN_{16-n}:Eu^{2+}$, where $2\leq m\leq 5$, $2\leq n\leq 10$, $0.01\leq X\leq 1$,
wherein the green phosphor includes at least one selected from a group consisting of $LuAG:Ce^{3+}$, $Sr_2SiO_4:Eu^{2+}$, $La_3Si_6N_{11}:Ce$ and $Ba_2SiO_4:Eu^{2+}$, and
wherein a mass ratio between the green phosphor, the amber phosphor and the red phosphor is in a range of 0.5 to 0.8:0.1 to 0.4:0.01 to 0.1.

12. The phosphor composition of claim 11, wherein the red phosphor includes at least one selected from a group consisting of $CaAlSiN_3:Eu^{2+}$, $SrAlSiN_3:Eu^{2+}$ and $Sr_2Si_5N_8:Eu^{2+}$.

13. The phosphor composition of claim 11, wherein at least one of the green phosphor, amber phosphor and red phosphor has an excitation wavelength of 300 nm to 500 nm.

14. A light emitting device package comprising:
a package body;
a light emitting device disposed on the package body;
a molding portion disposed on the package body so as to surround the light emitting device; and
the phosphor composition of claim 1, wherein the phosphor composition is excited using light emission from the light emitting device.

15. The light emitting device package of claim 14, wherein the phosphor composition is dispersed in the molding portion.

16. The light emitting device package of claim 14, wherein the phosphor composition is layered on and contacts the light emitting device.

17. The light emitting device package of claim 14, wherein the phosphor composition is layered on at least one of an outer face of the light emitting device, an exposed top face of the package body, and an outer face of the molding portion.

18. The light emitting device package of claim 14, wherein the light emitting device is configured to emit blue light.

19. The light emitting device package of claim 14, wherein light emission from the light emitting device package has a color coordinate: $Cx=0.328\pm0.02$ and $Cy=0.344\pm0.02$.

20. The light emitting device package of claim 14, wherein the light emitting device emits first light-emission and the phosphor composition emits second light-emission via excitation thereof using the first light-emission, wherein mixture between the first and second light-emissions has a color rendering index in a range of 70 to 99 inclusive.

21. An illumination apparatus comprising:
a substrate;
a light emitting device package; and
an optical member configured to divert a propagation path of a light beam emitted from the package,
wherein the package is disposed on the substrate,
wherein the package comprises:
a package body;
a light emitting device disposed on the package body;
a molding portion disposed on the package body so as to surround the light emitting device; and the phosphor composition of claim 1, wherein the phosphor composition is excited using light emission from the light emitting device.

* * * * *